(12) United States Patent
Wickman

(10) Patent No.: US 6,618,307 B2
(45) Date of Patent: Sep. 9, 2003

(54) DYNAMIC DRAM SENSE AMPLIFIER

(75) Inventor: Curtis A. Wickman, Arlington, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/946,219

(22) Filed: Sep. 5, 2001

(65) Prior Publication Data

US 2003/0043668 A1 Mar. 6, 2003

(51) Int. Cl.⁷ .................................................. G11C 7/02
(52) U.S. Cl. ........................ 365/207; 365/205; 365/208; 365/204
(58) Field of Search ................................ 365/205, 207, 365/208, 204

(56) References Cited

U.S. PATENT DOCUMENTS

| 5,764,572 A | * | 6/1998 | Hammick | 365/189.01 |
| 5,859,794 A | * | 1/1999 | Chan | 365/149 |
| 5,892,724 A | * | 4/1999 | Hasegawa et al. | 365/230.03 |
| 6,115,308 A | * | 9/2000 | Hanson et al. | 365/205 |
| 6,208,575 B1 | * | 3/2001 | Proebsting | 365/208 |
| 6,212,119 B1 | * | 4/2001 | Hatamian | 365/222 |
| 6,466,499 B1 | * | 10/2002 | Blodgett | 365/207 |
| 6,477,100 B2 | * | 11/2002 | Takemura et al. | 365/207 |

* cited by examiner

*Primary Examiner*—Richard Elms
*Assistant Examiner*—Toan Le
(74) *Attorney, Agent, or Firm*—Lahive & Cockfield, LLP

(57) ABSTRACT

A dynamic sense amplifier is provided that reduces the amount of time required to perform a memory cell restoration in a DRAM following a read operation. The dynamic sense amplifier can be isolated from the bit lines that it is sensing to avoid the capacitance affects of the bit line during a restoration operation. By avoiding the capacitance effects of the selected bit line during a restoration operation the dynamic sense amplifier is able to restore the just read memory cell to its original state in a more efficient manner.

15 Claims, 4 Drawing Sheets

DYNAMIC DRAM SENSE AMPLIFIER

TECHNICAL FIELD OF THE INVENTION

The present invention generally relates to a semiconductor device having an embedded memory and more particularly, to a semiconductor device having an embedded dynamic random access memory.

BACKGROUND OF THE INVENTION

A dynamic random access memory (DRAM) array is made up of a multitude of one transistor memory cells interconnected into a matrix formation. Interconnecting the memory cells of the DRAM array are multiple bit lines ("column lines") and multiple word lines ("row lines"). In the simplest form, each memory cell typically includes of an N channel metal oxide semiconductor transistor, known as an access transistor, and a storage capacitor. The gate of the access transistor is connected to a particular word line, the drain of the access transistor is connected to a bit line and the storage capacitor to the source of the access transistor. Data is stored in the memory cell as a charge on the storage capacitor. Hence, a logically high value (i.e. "1") is stored by charging the capacitor to a high voltage level and a logically low value (i.e. "0") is stored by discharging the capacitor to a low voltage level. Typically all bit lines are precharged to a mid point voltage level approximately equal to one half of a high voltage level (Vdd) and all word lines are precharged to a low voltage level.

The DRAM array is coupled to a word line decoder that selects a particular word line in response to a received word address. The word line decoder selects the decoded word line by raising the voltage of the particular word line to cause all the transistors on the selected word line to become conductive. As a result, the storage capacitors of all the memory cells on the selected word row are coupled to their respective bit lines.

If the memory cell on the selected word row is storing a logic "0", the storage capacitor of the memory cell initially holds a charge of zero volts. Shorting the storage capacitor to the memory cell's bit line, which capacitance is typically ten to twelve times greater than the capacitance of the storage capacitor, causes the cell storage capacitor to charge and the bit line capacitance to slightly discharge. As a result, the voltage of the corresponding bit line decreases and the voltage decrease is detected by a sense amplifier to which the bit line is coupled. The sense amplifier, in turn, amplifies the detected voltage drop and produces a logic "0" value. The amplifier asserts the resulting low voltage value on the bit line to discharge the storage capacity of the selected memory cell back to a logic "0" value or zero volts. In this manner, the selected memory cell is restored to its original logic value.

By contrast, if the selected memory cell is storing a logic "1" value when its storage capacitor is coupled to the memory cell bit line, the voltage level of the storage capacitor, which is normally lower than the voltage on the bit line, increases slightly. Thus, the discharging of the storage capacitor causes a slight increase in the voltage of the corresponding bit line. The small voltage change in the corresponding bit line is interpreted by the sense amplifier as a logic "1" value, and the sense amplifier produces a logic "1" voltage value. In turn, the sense amplifier asserts the logic "1" voltage value onto the corresponding bit line to charge the storage capacitor back to its original value.

Typically, the storage capacitor of the selected memory cell along with the bit lines of a DRAM device resist any abrupt change in voltage due to their large capacitance value. Consequently, the voltage level of a bit line changes over a period of time. Unfortunately, the input of the sense amplifier is typically cross coupled between two adjacent bit lines, and, as a result, upon completion of a sense operation voltage drop in the input voltage that the amplifier is amplifying. Consequently, the conventional DRAM sense amplifier is burdened with amplifying a variable input signal caused by the charge sharing effect of the selected memory cell and the bit line. As a consequence, the time required to restore a memory cell after a read or write operation occurs is significantly impacted.

SUMMARY OF THE INVENTION

The present invention addresses the above-described limitations of conventional sense amplifiers used in a DRAM. The present invention provides an approach to efficiently restore a memory cell of a dynamic random access memory array in less time than a conventional sense amplifier.

In one embodiment of the present invention, a dynamic sense amplifier is provided for a DRAM that reduces the time needed to restore a memory cell after a read operation. The dynamic sense amplifier includes a first inverter cross-coupled with a second inverter. To isolate each of the inverters from their corresponding bit line, the dynamic sense amplifier includes a first switch coupled between the input of the first inverter and the first bit line and a second switch coupled between the input of the second inverter and the second bit line. Each switch of the dynamic sense amplifier is coupled to a control signal to control when each switch is open and closed.

The above described approach benefits a semiconductor device having a DRAM array because the bit line inputs to the dynamic sense amplifier can be isolated from the charge sharing capacitive effects of the bit lines themselves. As a result, when the dynamic sense amplifier attempts to restore a memory cell to its original value following a read or write operation, the input to the amplifier is isolated to expedite restoration. Hence, the input to the dynamic sense amplifier is isolated from the charge sharing effects of the selected memory cell and the corresponding bit line.

In accordance with another aspect of the present invention, a DRAM device is provided with a first bit line and a second bit line coupled to a sense amplifier. The sense amplifier of the DRAM device is coupled to the first bit line and the second bit line through a first switch and a second switch respectively. In this manner, the inputs of the sense amplifier can be isolated from the first bit line and the second bit line when it is necessary to restore or refresh a memory cell of the DRAM.

The above described approach benefits any DRAM architecture that utilizes a DRAM in that the amount of time required to restore a memory cell following a read operation is significantly reduced for example, by ten percent. As a result, microprocessor processing efficiency is increased due to the great reduction in cell restoration time and in similar fashion the efficiency of performing a memory array refresh operation is also increased.

In accordance with still another aspect of the present invention, a method is performed in a DRAM array for restoring a memory cell. When an amplifier of the DRAM array detects a voltage change in a bit line, the amplifier amplifies the voltage change to assert the corresponding logic value. Once the amplifier asserts the logic value corresponding to the detected voltage change, the amplifier's input is isolated from the bit line to restore the just read memory cell to its original state. The amplifier's input is isolated from the bit line through the use of a switch. Moreover, the amplifier may service two or more columns of the dynamic random access memory, thus increasing layout efficiency of memory device.

BRIEF DESCRIPTION OF DRAWINGS

An illustrative embodiment of the present invention will be described below relative to the following drawings.

DETAILED DESCRIPTION OF AN ILLUSTRATIVE EMBODIMENT

The illustrative embodiment of the present invention provides a semiconductor device for increasing the efficiency of performing a memory cell restoration in a DRAM. In the illustrative embodiment, a dynamic sense amplifier is adapted to have a switch in circuit with each of its bit line input nodes. As a result, the switches may be opened and closed to isolate the bit line inputs of the dynamic sense amplifier from their corresponding bit lines of the DRAM. Each switch of the dynamic sense amplifier is closed during a read operation to allow the dynamic sense amplifier to sense the voltage change on the selected bit line and in turn assert the proper logic value onto the bit line. Thereafter, the switches are opened so that the bit line inputs of the dynamic sense amplifier are isolated from the corresponding bit line so that the amplifier may restore the just read memory cell without having to overcome voltage fluctuations on its bit line input node.

The switches in circuit with the bit line inputs of the dynamic sense amplifier and the corresponding bit lines allow for faster memory cell restoration, because the input voltage to the dynamic sense amplifier can be held at a steady rate. Hence, the switches of the dynamic sense amplifier isolate the bit line inputs from the capacitance affects of each of the coupled bit lines.

In the illustrative embodiment, the dynamic sense amplifier is attractive for use in microprocessors having embedded DRAM. In this manner, the microprocessors read cycle may be shortened to increase the number of instructions the microprocessor may handle over a period of time. Those skilled in the art will recognize that the dynamic sense amplifier of the illustrative embodiment may be coupled to one bit line.

Figure 1:
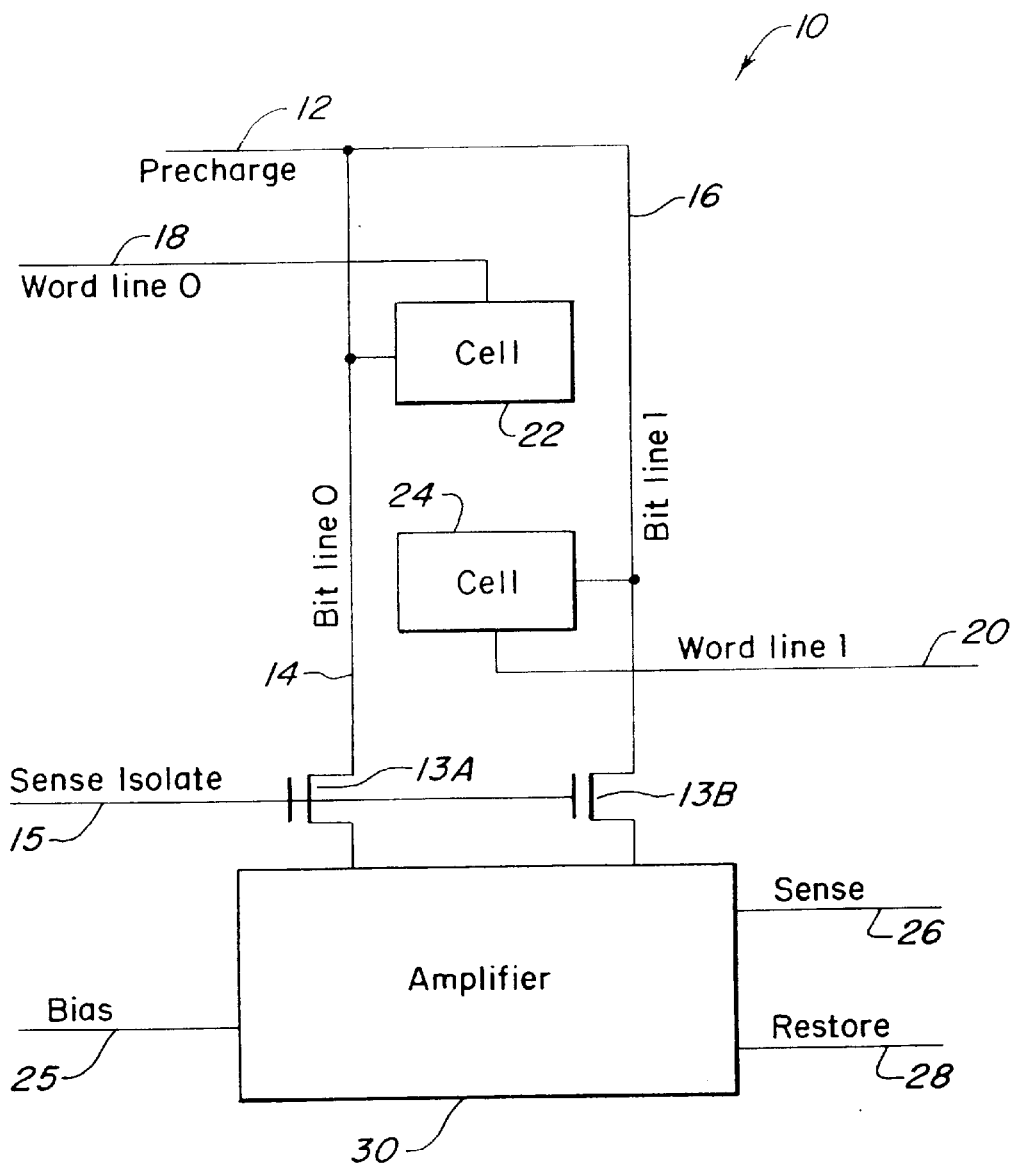
FIG. 1 depicts a block diagram of a DRAM cell suitable for practicing the illustrative embodiment of the present invention.

FIG. 1 is an illustrative block diagram of an exemplary DRAM device 10 that is suitable for practicing the illustrative embodiment of the present invention. The exemplary DRAM device 10 includes a bit line 14 coupled to a memory cell 22 and a bit line 16 coupled to memory cell 24. A word line 18 is coupled to the memory cell 22 and a word line 20 is coupled to memory cell 24. The bit line 14 and the bit line 16 are also coupled to the pre-charge node 12 so that they can be pre-charged to a known voltage level, such as Vdd/2 before a read operation occurs. The bit line 14 is coupled to the dynamic sense amplifier 30 via the NMOS isolate transistor 13A while the bit line 16 is coupled to the dynamic sense amplifier 30 via the NMOS isolate transistor 13B. Those skilled in the art will recognize that the exemplary DRAM device 10 may include a PMOS transistor that operates as the pre-charge device or the exemplary DRAM device 10 may be pre-charged by the bit line decoder circuit that is not shown. Moreover, one of ordinary skill in the art will recognize that more than one DRAM cell can be coupled to a bit line. Those skilled in the art will also recognize that the storage capacitor within the memory cell 22 and 24 includes at least two electrodes. One electrode of the storage capacitor is known as the storage node and is connected to the source of the memory cell access transistor. The other electrode of the storage capacitor is known as the cell plate and is based at the cell plate voltage level (Vcp).

The dynamic sense amplifier 30 is coupled to the bit line 14 and the bit line 16 to detect a voltage change on either bit line during a read operation. The sense isolate transistors 13A and 13B are disabled to allow the dynamic sense amplifier 30 to sense the voltage level difference between the bit line 14 and the bit line 16. In addition, the dynamic sense amplifier 30 is coupled to the sense control signal 26 that indicates to the dynamic sense amplifier 30 when to sense the coupled bit lines and assert a logic value based on the detected voltage change in the selected bit line coupled thereto. The dynamic sense amplifier 30 is also coupled to the memory restore control signal 28 that controls when switches of the dynamic sense amplifier 30 are open and closed in order to isolate the bit line inputs of the dynamic sense amplifier 30 from the bit line 14 and the bit line 16. Also coupled to the dynamic sense amplifier 30 is the bias control signal 25 to negatively bias the substrate portion of the switches that are coupled to each bit line and each bit line amplifier input. One skilled in the art will recognize that the bias line 15 can also be used in the memory array to negatively bias the access transistor in each memory cell. The details of the dynamic sense amplifier 30 will be discussed below with reference to FIG. 2 and FIG. 3.

Those skilled in the art will appreciate that the depiction of the exemplary DRAM device 10 in FIG. 1 is intended to be merely illustrative and not limiting of the present invention. For example, there maybe up to eight bit lines coupled to the dynamic sense amplifier 30 and each bit line may have significantly more memory cells coupled thereto, for example 256 or more.

Figure 2:
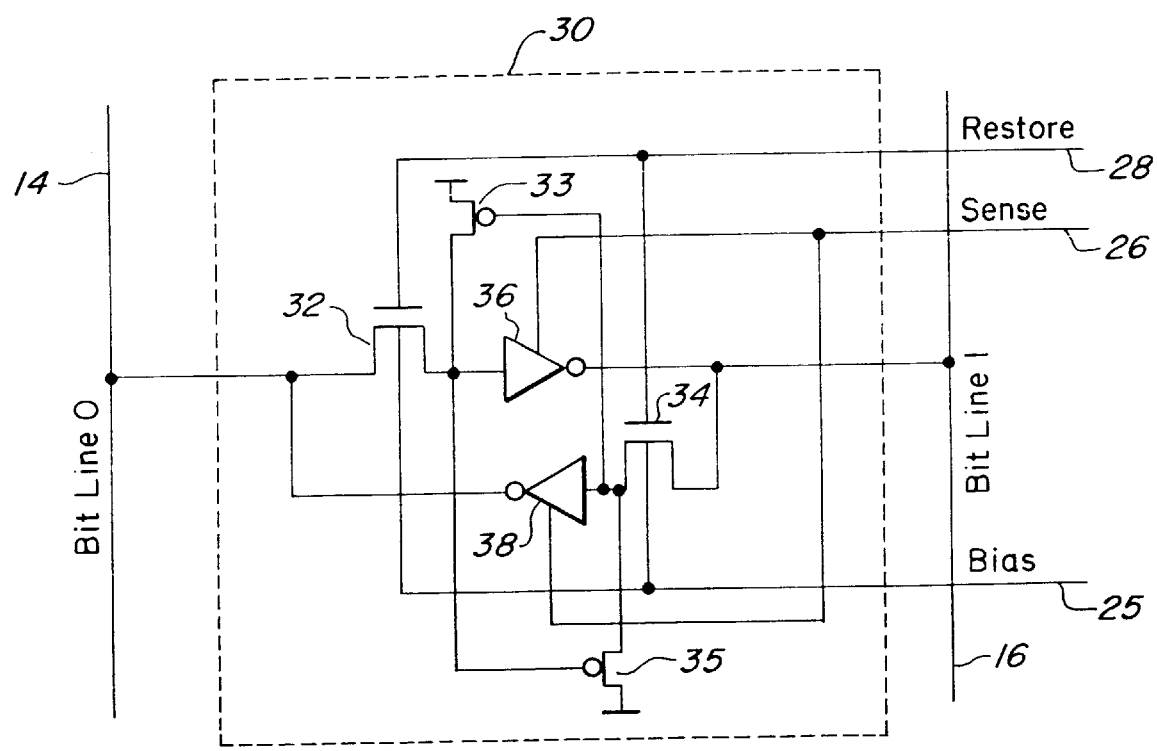
FIG. 2 depicts a dynamic sense amplifier that is suitable for practicing the illustrative embodiment of the present invention.
Figure 3:
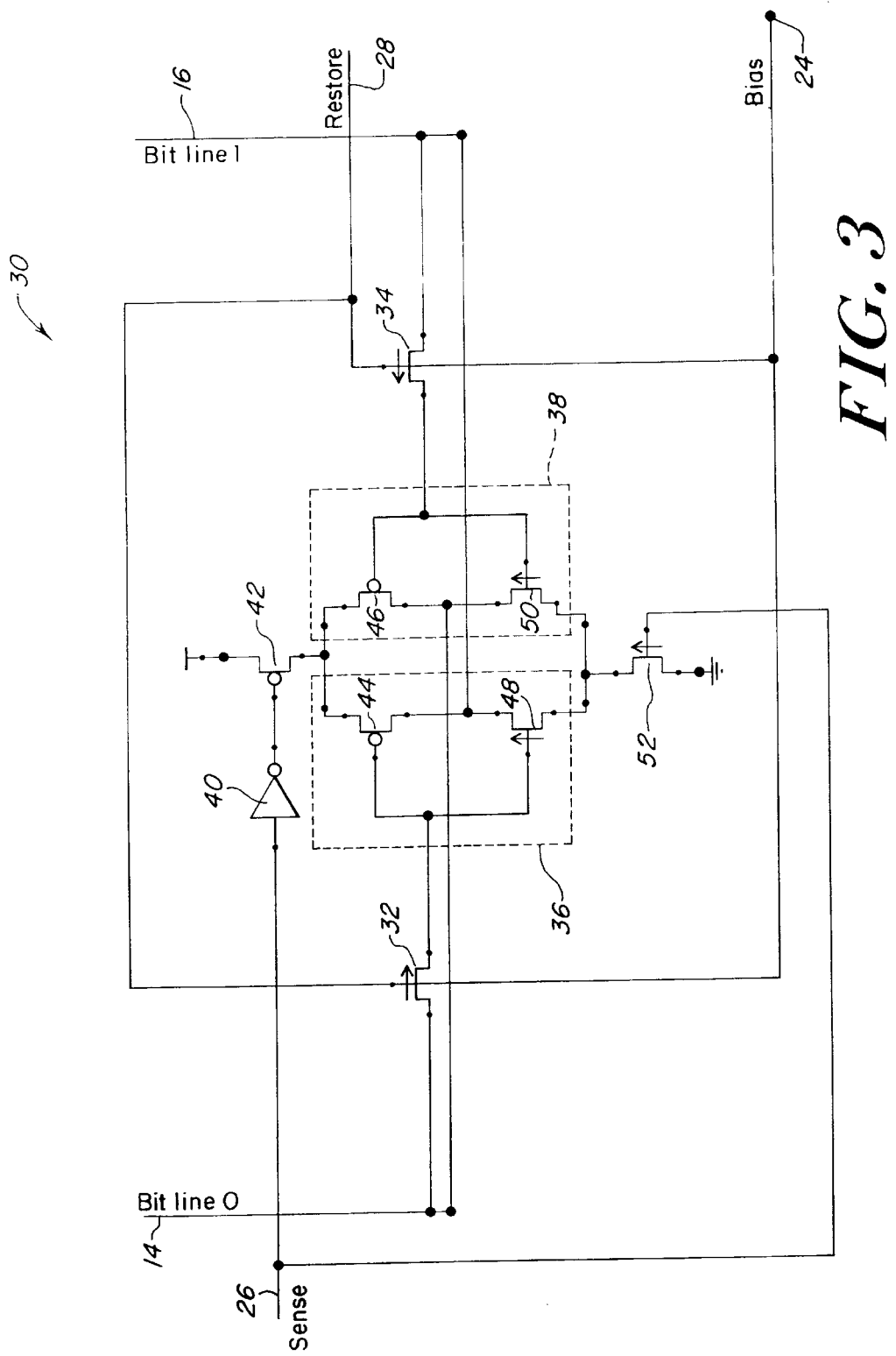
FIG. 3 is a more detailed representation of the dynamic sense amplifier in FIG. 2.

The transistors depicted in FIGS. 2 and 3 are from the metal oxide semiconductor field effect transistor (MOSFET) family of transistors, which includes P-channel MOSFETS (also referred to as PMOS transistors or P-FETS), and n-channel MOSFETS (also referred to as NMOS transistors or NFETS), and complementary symmetry MOSFETS (also referred to as C-MOS transistors).

As illustrated in FIG. 2, the dynamic sense amplifier 30 is configured to have a switch 32 coupled to the bit line 14 and the input of the inverter 36. The output of the inverter 36 is coupled to the bit line 16. In similar fashion, the switch 34 is coupled to the input of the inverter 38 and the bit line 16. The inverter 38 has its output coupled to the bit line 14. The switch 32 and the switch 34 each have their gates coupled to the restore control signal 28. In more detail, the switch 32 has its source coupled to bit line 14 and its drain coupled to the input of the inverter 36, and the switch 34 has its source coupled to bit line 16 and its drain coupled to the input of inverter 38. The substrate of the switch 32 and the switch 34 are coupled to the bias control signal 25. In this manner, the substrate of the switch 32 and the switch 34 are negatively biased to raise the threshold voltage of each switch to help overcome the affects of current leakage on each switch. The sense control signal 26 is coupled to the inverter 36 and the inverter 38 to control when the dynamic sense amplifier 30 is able to detect a voltage level change in either the bit line 14 or the bit line 16.

The dynamic sense amplifier 30 may also be configured to include a keeper device 33 and a keeper device 35 to keep each inverters input at a known state. Those skilled in the art will recognize that the keeper device 33 and the keeper device 35 are PMOS transistors and that they are optional devices.

In operation, the bit line 14 and the bit line 16 are pre-charged to a voltage level equal to about approximately one half of the voltage level Vdd by a pre-charge device such as a PMOS transistor (not shown). Typically, the bit line 14 and the bit line 16 are pre-charged during the B-phase of the system clock, that is when the clock is at a logic "0" level. Those skilled in the art will recognize that the pre-charge operation may also occur during the A-phase of the system clock, that is, when the clock is at a logic "1" level. Before any memory cell is selected, the word line 18 and the word line 20 are also pre-charged to a logic "0" level. When the bit lines and the word lines of the exemplary DRAM device 10 have been pre-charged to their respective voltage and logic levels. The exemplary dynamic random access memory device 10 is ready to respond to a read operation or a write operation.

In a read operation, a word line decoder circuit (not shown) selects a particular word line by raising the voltage level of the selected word line to a voltage level about equal to Vdd plus the threshold voltage of the access transistor (Vth), or what is known in the art as a boosted word line voltage level, represented by. As a result, all the transistors in the selected word line become conductive; thus connecting the storage capacitors of all the memory cells of the selected word row to their respective bit lines. For example, if the decoder circuit selects the word line 18, the transistor of the memory cell 22 becomes conductive and shorts the storage capacitor in the memory cell 22 to the bit line 14. In this manner, the memory cell 22 delivers a small signal value to the bit line 14. Typically, the capacitance value associated with the bit line 14 relative to the capacitance value of the memory cell 22 is about ten to twelve times greater in value.

Those skilled in the art will recognize that the small signal logic value delivered by the memory cell 22 when selected is determined by applying the charge sharing principle. That is, when the word line 18 is deselected and in the storing state, the storage capacitor of the memory cell 22 is charged to either a logic "1" level or a logic "0" level and the corresponding bit line is precharged to a level equal to about approximately one half of Vdd. The total charge stored in the storage capacitor of the memory cell 22 and the capacitance of the bit line 14 is approximately equal to the product of the capacitance of bit line 14 and the precharge voltage value level of the bit line 14 plus the product of the capacitor value of the storage capacitor in memory cell 22 and the voltage differential across the storage capacitor. Thus when the word line is asserted, the charge of the storage capacitor is transferred to the bit line 14 and the voltage of the storage node in the memory cell 22 becomes equal to that of the bit line 14, but the total charge is not changed. As a consequence, the small signal logic value delivered by the memory cell 22 that represents a logic "1" level is approximately equal to precharge voltage level of the bit line 22 divided by the result of dividing the capacitance of the bit line 14, by the capacitance of the capacitor of the memory cell 22 and adding one (1) to the result. A small signal logic value delivered by the memory cell 22 that represents a logic "0" level has a magnitude opposite of the small signal logic value that represents a logic "1" level.

If the memory cell 22 is storing a logic "0" value, the storage capacitor for the cell is initially at about zero volts. Shorting the storage capacitor of the memory cell 22 to the bit line 14 causes the storage capacitor to charge and the capacitance of the bit line 14 to discharge. Consequently, the voltage of the bit line 14 decreases, the NMOS sense isolate transistors 13A and 13B are disabled, and the voltage decrease is detected by the dynamic sense amplifier 30. In this example, because the voltage level on the bit line 14 decreases the inverter 36 detects the voltage change so long as the sense control signal 26 is at a logic "1" level. The dynamic sense amplifier 30, in turn, amplifies the detected voltage drop in the bit line 14 and produces a logic "0" value on the bit line 14. Those skilled in the art will recognize that the dynamic sense amplifier 30 can be configured to sense a bit line when the sense control 26 is at a logic "0" level.

In contrast, if the storage capacitor of the selected memory cell 22 is storing a voltage value corresponding to a logic "1" when the storage capacitor is shorted to the bit line 14, the voltage value of the bit line 14 increases a slight amount. The slight increase in the voltage level of the bit line 14 is the result of the charge-sharing principle between the bit line 14 and the storage node of the storage capacitor in the memory cell 22. Nevertheless, the dynamic sense amplifier 30 detects the voltage change of the bit line 14 when the sense control signal 26 is at a logic "1" level and asserts a logic "1" level on the bit line 14.

Since the restoration of a DRAM memory cell is considered destructive, the just read memory cell must be returned to its original state before the read operation completes. For example, in the instance above where the memory cell 22 was storing a logic "0" value, the dynamic sense amplifier 30 drives the bit line 14 to a logic "0" level after sensing the voltage change on the bit line 14 to restore the storage capacitor of the memory cell 22 to its original state. In like manner, if the memory cell 22 originally stored a logic "1" value the dynamic sense amplifier 30 drives the bit line 14 to a logic "1" level to return the storage capacitor of the memory cell 22 to its previous state before the read operation completes.

During the restore portion of the read operation, the voltage value of the selected bit line does not change instantaneously due to the large capacitance value of the selected bit line. To overcome the effects of the time varying voltage value of the bit lines at the bit line input nodes of the dynamic sense amplifier 30 when a memory cell restoration occurs, the input of the inverter 36 and the input of the inverter 38 are isolated from their respective bit line to capture and hold a constant voltage value at the bit line inputs of the dynamic sense amplifier 30 to restore the just read memory cell to its original state.

To capture and hold the voltage value at a constant value at the input of inverter 36, the restore control signal 28 is driven low to prevent the NMOS transistor 32 from conducting. In like manner, when the restore control signal 28 is driven low, the NMOS transistor 34 is also prevented from conducting to isolate the input of the inverter 38 from the bit line 16 to hold the voltage value at its input node at a constant value. In this manner, the inputs of the inverter 36 and inverter 38 are isolated from the bit line 14 and the bit line 16 respectively, to avoid the capacitance affects of each bit line on the bit line inputs of the dynamic sense amplifier 30 during a memory cell restore operation. In this manner, the memory cell 22 is restored to its original state in less time and in a more efficient manner.

FIG. 3 illustrates the dynamic sense amplifier 30 of the illustrative embodiment in more detail. The inverter 36 includes PMOS transistor 44 and NMOS transistor 48. The PMOS transistor 44 has its gate coupled to the drain of NMOS transistor 32 and the gate of NMOS transistor 48. The source of the PMOS transistor 44 is coupled to the drain of the PMOS transistor 42, and the drain of the PMOS transistor 44 is coupled to the drain of the NMOS transistor 48. The NMOS transistor 48 has its source coupled to the drain of NMOS transistor 52 and its drain coupled to the bit line 16. Similarly, the inverter 38 is configured with PMOS transistor 46 and NMOS transistor 50. The PMOS transistor 46 has its source coupled to the drain of the PMOS transistor 42, its gate coupled to the drain of the NMOS transistor 34, and its drain coupled to the bit line 14 and the drain of the NMOS transistor 50. The NMOS transistor 50 has its source coupled to the drain of the NMOS transistor 52, its gate coupled to the gate of the PMOS transistor 46 and the drain of the NMOS transistor 34. The drain of the NMOS transistor 50 is coupled to the drain of the PMOS transistor 46.

The sense control signal 26 is coupled to the input of the inverter 40 and the gate of the NMOS transistor 52. The output of the inverter 40 is coupled to the gate of the PMOS transistor 42. The PMOS transistor 42 has its source coupled to a voltage source supplying a high level voltage signal. In contrast, the NMOS transistor 52 has its source coupled to ground.

The sense control signal 26 controls when the dynamic sense amplifier 30 is able to sense the bit line 14 and the bit line 16. When the sense control signal 26 is at a logic "1" level, the PMOS transistor 42 and the NMOS transistor 52 are both conductive. At the same time, the restore control signal 28 is at a logic "1" level to allow the NMOS transistor 32 and the NMOS transistor 34 to conduct. In this manner, the inverter 36 and 38 can detect any change in the bit line 14 and the bit line 16. When the sense control signal 26 and the restore control signal 28 both fall to a logic "0" level the NMOS transistors 32, 34, and 52 and the PMOS transistor 42 are no longer conductive. At this point, the input of the inverter 36 and the input of the inverter 38 are isolated from their respective bit lines. Those skilled in the art will appreciate that the dynamic sense amplifier 30 can be configured to use the true or complement of the control signals, such as the sense control signal 26 and the restore control signal 28.

Figure 4:
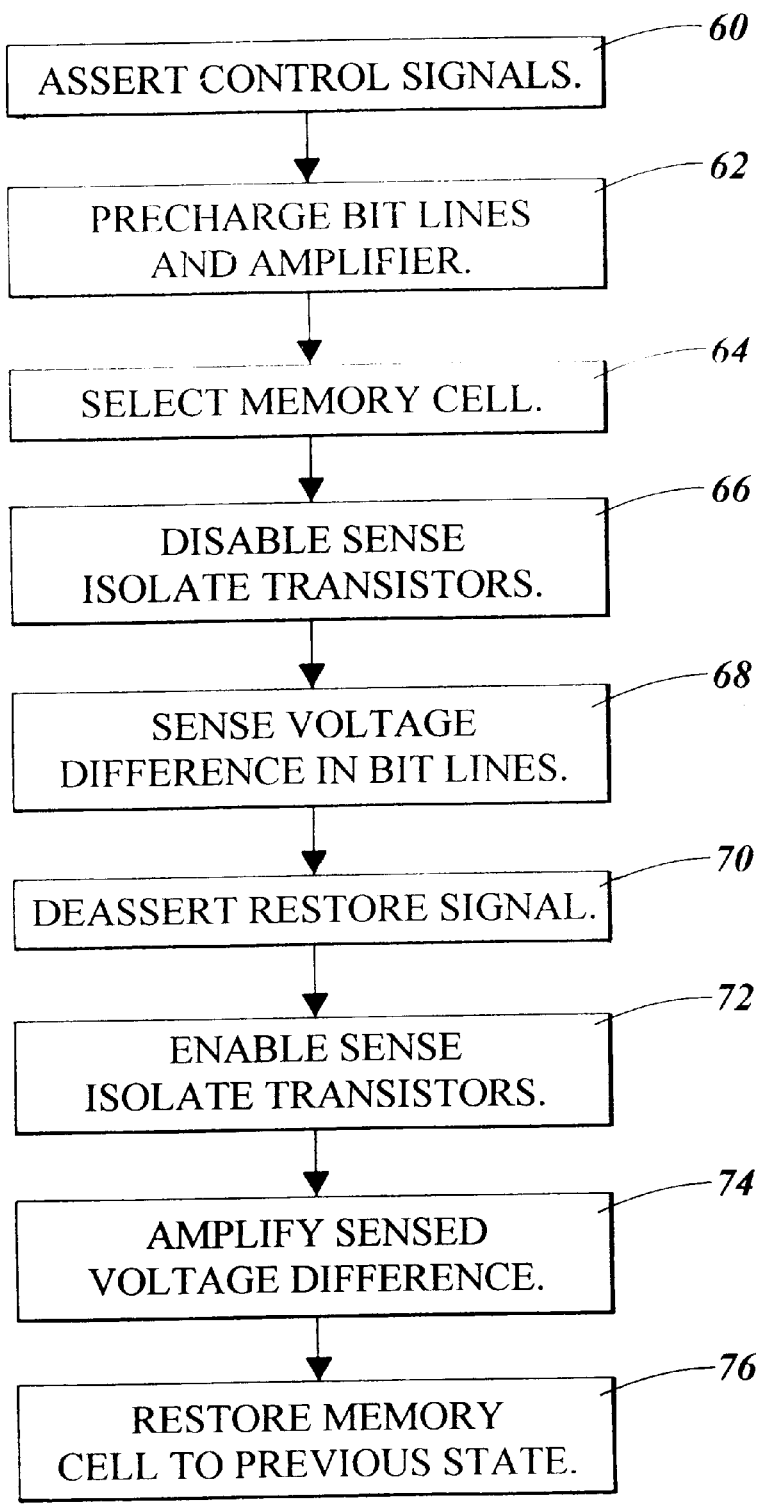
FIG. 4 is a flow chart illustrating the steps taken to restore a memory cell of a DRAM of the illustrative embodiment.

With reference to FIG. 1, FIG. 3 and FIG. 4 the operation of the dynamic sense amplifier 30 will be discussed in more detail. To allow the dynamic sense amplifier 30 to detect a voltage change in either the bit line 14 or the bit line 16, the sense isolate control signal 15 and the restore control signal 28 are raised to a logic "1" level to allow the NMOS transistor 13A, 13B, 32 and 34 to conduct (step 60 in FIG. 4). At this point, the dynamic sense amplifier 30 is precharged to a voltage level about equal to one half of Vdd and is in a state to determine if a memory cell corresponding to the bit line 14 or a memory cell corresponding to the bit line 16 has been selected due to a voltage change in either the bit line 14 or the bit line 16 (step 62 in FIG. 4). Those skilled in the art will recognize that other precharge techniques can be utilized to precharge the dynamic sense amplifier 30 without departing from the scope of the present invention. For example, the dynamic sense amplifier 30 can be configured with precharge devices.

If the word line 20 is selected a small voltage difference occurs between the bit line 14 and 16(step 64 in FIG. 4). At this point the sense isolate signal 15 is deasserted to turn off NMOS transistor 13A and 13B (step 66 in FIG. 4). The dynamic sense amplifier 30 detects the voltage difference in the bit line 16, by raising the sense control signal 26 to a logic "1" level to allow the NMOS transistor 34 to pass the voltage change to the gate of the PMOS transistor 46 and the gate of the NMOS transistor 50. If the voltage difference corresponds to a logic "0" value, the PMOS transistor 46 becomes conductive and passes a logic "1" level from the PMOS transistor 42 to drive the input of the inverter 36 (step 68 in FIG. 4). At this point, the restore control signal 28 is driven low to isolate the bit line inputs of the dynamic sense amplifier 30 from the bit line 14 and 16 (step 70 in FIG. 4). The sense isolate signal 15 is again asserted to couple the output of the dynamic sense amplifier 30 to bit line 14 and 16 while the selected word line is deasserted (step 72 in FIG. 4). The logic "1" level asserted by the inverter 38 is passed by the NMOS transistor 32 to the gate of the PMOS transistor 44 and the NMOS transistor 48. Since the inverter 38 is asserting a logic "1" level, the NMOS transistor 48 becomes conductive and passes a logic "0" value from the NMOS transistor 52 to amplify the detected voltage change and drive the bit line 16 to a logic "0" level (step 74 in FIG. 4).

As a result of deasserting the restore control signal 28, the input to the inverter 36 and the input to the inverter 38 are isolated from the bit line charge-sharing principle on their respective bit lines. Consequently the voltage values at the input of the inverter 36 and the inverter 38 are held near constant and the inverter 36 is able to drive the bit line 16 to a logic "0" level to restore the selected memory cell to its original state in a more efficient manner (step 76 in FIG. 4). Those skilled in the art will appreciate the above described operation is meant to be illustrative and not limiting of the present invention. For example, if the dynamic sense amplifier 30 detects a voltage change corresponding to a logic "1" value on the bit line 16 the NMOS transistor 50 conducts, which, in turn, causes the PMOS transistor 44 to amplify the detected voltage change and assert a logic "1" level on the bit line 16.

While the present invention has been described with reference to a preferred embodiment thereof, one skilled in the art will appreciate that various changes in form and detail may be made without departing from the intended scope of the present invention as defined in the pending claims.

What is claimed is:

1. A dynamic sense amplifier for a dynamic random access memory (DRAM) having one or more memory cells where each of said one or more memory cells holds an original value, said dynamic sense amplifier comprising:

a first inverter having an input node and an output node;

a second inverter having an input node and an output node, wherein said first inverter and said second inverter are cross coupled to each other;

a first switch coupled to said input node of said first inverter and a first bit line of said DRAM;

a second switch coupled to said input node of said second inverter and a second bit line of said DRAM; and whereby said first switch and said second switch isolate said input node of said first inverter and said input node of said second inverter to return said one or memory cells of said DRAM to said original value.

2. The dynamic sense amplifier of claim 1, further comprising;

a first keeper circuit coupled to said input node of said first inverter and a second keeper circuit coupled to said input node of said second inverter to keep said input node of said first inverter and said second inverter at a known state.

3. The dynamic sense amplifier of claim 1, wherein said first switch and said second switch comprise a negative channel metal oxide semiconductor field effect transistor.

4. The dynamic sense amplifier of claim 1, wherein said first and said second switch comprise a positive channel metal oxide semiconductor field effect transistor.

5. The dynamic sense amplifier of claim 1, further comprising a control signal input node to control when said first and second switch are open and closed.

6. A dynamic sense amplifier having a plurality of input nodes to receive a plurality of inputs, said dynamic sense amplifier comprising:

a first inverter having an input node and an output node;

a second inverter having an input node and an output node, wherein said first inverter and said second inverter are cross coupled to each other;

a first switch coupled to said input node of said first inverter and to a first of the input nodes of said dynamic sense amplifier;

a second switch coupled to said input node of said second inverter and to a second of the input nodes of said dynamic sense amplifier; and whereby said first switch and said second switch isolate said input node of said first inverter and said input node of said second inverter to return one or more memory cells coupled to said dynamic sense amplifier to an original value.

7. The dynamic sense amplifier of claim 6, further comprising;

a first keeper circuit coupled to said input node of said first inverter and a second keeper circuit coupled to said input node of said second inverter to keep said input node of said first inverter and said second inverter at a known state.

8. The dynamic sense amplifier of claim 6, wherein said first switch and said second switch comprise a negative channel metal oxide semiconductor field effect transistor.

9. The dynamic sense amplifier of claim 6, wherein said first and said second switch comprise a positive channel metal oxide semiconductor field effect transistor.

10. The dynamic sense amplifier of claim 6, further comprising a control signal input node to control when said first and second switch are open and closed.

11. An amplifier capable of sensing a first value and a second value and producing an output based on the sensing of the first and second value, said amplifier comprising:

a first switch having an open state and a closed state in electrical communication with a first input node of the amplifier, the first input node receiving the first value; and a second switch having an open state and a closed state in electrical communication with a second input node of the amplifier, the second input node receiving the second value;

wherein the amplifier senses the first and second value when the first and second switch are in their respective closed state to produce the output and the amplifier returns one of the first value and the second value to its original value when the first and second switch are in their respective open states.

12. The amplifier of claim 11, wherein the amplifier comprises a dynamic sense amplifier.

13. The amplifier of claim 11, further comprising, a first inverter having an output node coupled to the second input node of the amplifier and an input node coupled to the first switch, the first switch is coupled between the first input node of the amplifier and the input node of the first inverter;

a second inverter having an output node coupled to the first input node of the amplifier and an input node coupled to the second switch, the second switch is coupled between the second input node of the amplifier and the input node of the second inverter; and whereby said first switch and said second switch isolate said input node of said first inverter and said input node of said second inverter to return one of the first value and the second value to its original value when the first and second switch are in their respective open states.

14. The amplifier of claim 11, wherein the first input node is coupled to a first bit line of a memory array and the second input node is coupled to a second bit line of the memory array.

15. The amplifier of claim 14, wherein the memory array comprises a plurality of DRAM cells.

* * * * *